United States Patent
Cafaro et al.

(10) Patent No.: US 7,570,096 B2
(45) Date of Patent: Aug. 4, 2009

(54) DIRECT DIGITAL SYNTHESIZER WITH VARIABLE REFERENCE FOR IMPROVED SPURIOUS PERFORMANCE

(75) Inventors: Nicholas G. Cafaro, Coconut Creek, FL (US); Thomas L. Gradishar, Boynton Beach, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 132 days.

(21) Appl. No.: 11/861,860

(22) Filed: Sep. 26, 2007

(65) Prior Publication Data
US 2008/0258791 A1    Oct. 23, 2008

Related U.S. Application Data

(62) Division of application No. 11/370,689, filed on Mar. 8, 2006, now Pat. No. 7,315,215.

(51) Int. Cl.
*H03H 11/26* (2006.01)

(52) U.S. Cl. ............... 327/262; 327/264; 327/270; 327/271; 327/272; 327/288

(58) Field of Classification Search ......... 327/261–275, 327/284–289
See application file for complete search history.

(56) References Cited

U.S. PATENT DOCUMENTS
7,315,215 B2 * 1/2008 Cafaro et al. .............. 331/16

* cited by examiner

*Primary Examiner*—David Mis

(57) ABSTRACT

Improvement of quantization errors that arise in a delay line with finite resolution. A direct digital synthesizer (DDS), which contains a numerically controlled oscillator (NCO) and a digital-to-phase converter (DPC), is placed in the feedback loop of a phase locked loop (PLL). The DDS is used as a fractional divider of the voltage controlled oscillator (VCO) frequency, such that the reference frequency of the DDS is made variable. Alignment of the edges provided by the DDS delay line may then be adjusted. Mismatch errors in the DDS delay line are reduced by utilizing independently tunable delay elements.

6 Claims, 4 Drawing Sheets

-PRIOR ART-

DIRECT DIGITAL SYNTHESIZER WITH VARIABLE REFERENCE FOR IMPROVED SPURIOUS PERFORMANCE

CROSS REFERENCE TO RELATED APPLICATIONS

This application is a divisional of U.S. application Ser. No. 11/370,689, filed Mar. 8, 2006 and assigned to Motorola, Inc.

BACKGROUND

Spurious performance is often a challenging specification to achieve in direct digital synthesizers (DDS). Digital to analog converters (DAC) based DDS are limited by the resolution of the DAC, and digital to time converter (DTC) based systems are limited by the resolution and error achievable in the output tapped delay line. Improvement in the spurious performance of DTC systems depends on overcoming problems with increasing the accuracy and resolution of the output tapped delay line.

The resolution of the tapped delay line is determined by the minimum delay element used in the output tapped delay line and is often limited by the process technology. For example, a delay line with 32 taps operating at 1 GHz will have a resolution of the period divided by the number of taps or 1 ns/32=31.25 ps. There are ways to improve the resolution by using other configurations such as differential delay lines or locking to multiple wavelengths. However, for practical purposes, a tapped delay line will never have infinite resolution. This finite resolution will limit the accuracy to which the DDS output can place an edge. This phenomenon is called quantization error and it leads to spurious frequency components in the output.

Another source of spurs arises from mismatch errors in the delay line. Mismatch errors between transistors, which are unavoidable in integrated circuits, will cause unequal delays across the delay line and cause errors in the edge placements at the output of the DDS.

BRIEF DESCRIPTION OF THE DRAWINGS

The features of the invention believed to be novel are set forth with particularity in the appended claims. The invention itself, however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
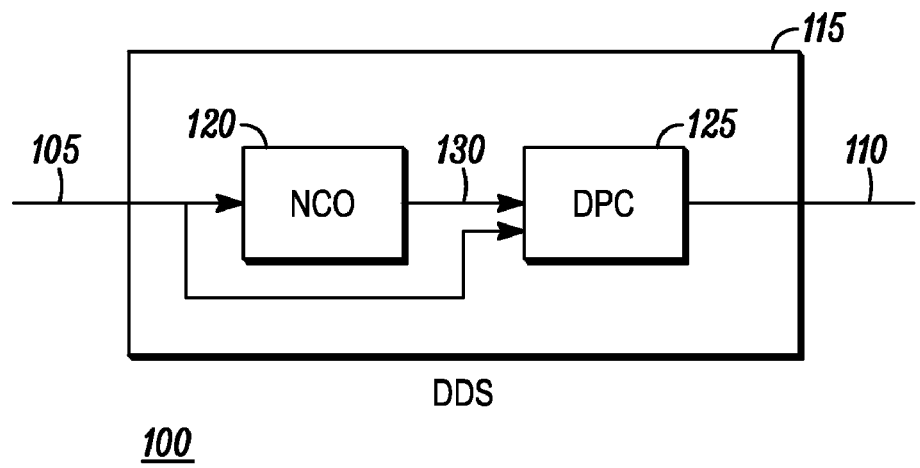
FIG. 1 is a block diagram of a direct digital synthesizer with Digital-to-Phase Converter(s), according to the prior art.

Various exemplary block diagrams, circuits, and methods for a direct digital synthesizer with variable reference for improved spurious performance are presented, in accordance with certain embodiments.

Many variations, equivalents and permutations of these illustrative exemplary embodiments will occur to those skilled in the art upon consideration of the description that follows. The particular examples utilized should not be considered to define the scope of the invention. For example discrete circuitry implementations and integrated circuit implementations, and hybrid approaches thereof, may be formulated using techniques and structures of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

For purposes of this document, the exact mechanical and electrical parameters of equipments are unimportant to an understanding of the invention, and many different types of electrical and mechanical components may be utilized without departing from the spirit and scope of the invention. An example is that components utilized in the circuit may differ as to value, composition material, power rating, and physical size. This document uses generalized descriptions by way of example only. Many variations for these constituent items are possible without departing from the spirit and scope of the invention.

There have been no known previous attempts to minimize quantization error in the delay line by modifying the reference frequency in synchronization with the output frequency. Mismatch errors were previously addressed by dithering the tap selections within the digital block.

U.S. Pat. No. 4,409,564 (Pulse Delay Compensation for Frequency Synthesis) describes a phase lock loop (PLL) with a fractional divider, and the scheme presented offers none of the benefits of a direct digital synthesizer (DDS) such as improved tuning range and decreased lock time.

Refer to FIG. 1, which is a block diagram 100 of a DDS with Digital-to-Phase Converter(s), according to the prior art. The digital-to-phase converter DPC 125 function of DDS 115 may be comprised of a tapped delay line whose outputs are assembled into an output frequency Fout 110, according to instructions from a numerically controlled oscillator NCO 120. The output 130 of NCO 120 is routed to one input of DPC 125, and reference frequency 105 is routed to the other input of DPC 125. Reference frequency 105 also is the input of NCO 120 as shown. NCO 120 may be comprised of an accumulator function whose overflow represents the desired phase from DPC 125. Multiple DPCs (not shown) may be used to supply multiple independent output signals Fout 110. The resolution of the tapped delay line is determined by the minimum delay element used in the tapped delay line and is often limited by the process technology. For example, a delay line with 32 taps operating at 1 GHz will have a resolution of the period divided by the number of taps or 1 ns/32=31.25 ps. There are ways to improve the resolution (not shown) by using other configurations like differential delay lines or locking to multiple wavelengths. However, for practical purposes, a tapped delay line will never have infinite resolution. This finite resolution will limit the accuracy to which DDS 115 Fout 110 can place an edge. This phenomenon is called quantization error and it leads to spurious frequency components in the output Fout 110.

Another source of spurs arises from mismatch errors in the delay line components. Mismatch errors between transistors, which are unavoidable in integrated circuits, will cause unequal delays across the delay line and cause errors in the edge placements at the output of the DDS.

Figure 2:
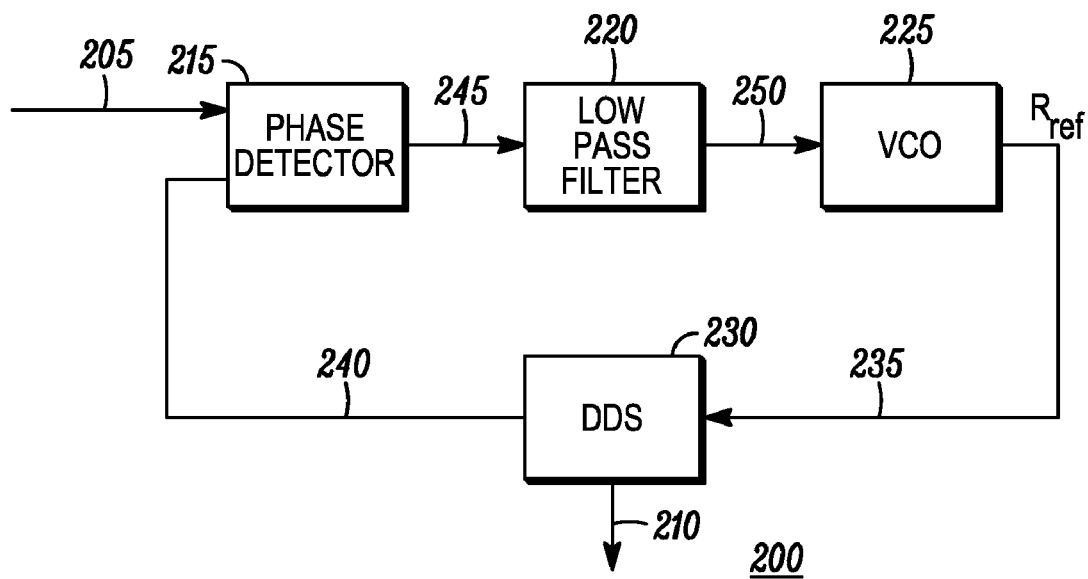
FIG. 2 is a block diagram of a direct digital synthesizer in the phase lock loop feedback loop, utilized in accordance with certain embodiments.

Refer to FIG. 2, which is a block diagram 200 of a DDS in the PLL feedback loop, utilized in accordance with certain embodiments of the present invention. This invention covers various approaches, embodied in at least two embodiments for reducing spurious levels at the output of a DDS that employs digital to phase conversion. The first method addresses quantization errors that arise in a delay line with finite resolution. Phase detector 215 has two inputs, reference frequency 205 and feedback signal 240. Phase detector output 245 is routed to the input of lowpass filter 220. Lowpass filter output 250 is routed to the input of VCO 225. VCO output 235 is routed to the input of DDS 230. The desired output is DDS output 210. One way to minimize quantization error is to use the DDS 230 in the feedback loop of the PLL. The idea is to use DDS 230 as a fractional divider, using the feedback signal 240 to tune PLL 200 with fine resolution. The ultimate goal is to tune PLL 200 so that quantization error will be minimized for a given RF output frequency. For example, if PLL 200 reference frequency 205 is at 1 GHz, the requested RF output of DDS 230 might require transitions in time that fall between two available tap positions. If the PLL were adjusted slightly, it could reduce the quantization spurs by ensuring that the required transitions of the RF output would fall directly on an available tap delay time.

The algorithm for determining the adjustment is as follows:

Correction to PLL frequency=(normalized quantization error)×(Fout)

The quantization is normalized to one because 0<R<1 in the following equation:

$$\frac{F_{ref}}{F_{out}} = N + R$$

For example, if Fref=1 GHz and Fout=480 MHz, then N=2 and R=0.08333. The quantization error, $\epsilon$, is the difference between the nearest tap (tap 3 in this case) and the R-value of 0.0833. For a 32-tap delay line:

$$\varepsilon = \frac{3}{32} - 0.0833 = 0.010416$$

So the new PLL reference frequency is $F_{ref}=1e9+(\epsilon \cdot F_{out})=1e9+(0.010416 \cdot 480e6)$
$=1.004999e9$ The largest range over which PLL 200 frequency needs to be tuned is determined by the maximum possible quantization error multiplied by the maximum possible output frequency. For example, the maximum quantization error is one half of a tap delay or 1/64. If the maximum PLL frequency is 1 GHz, then the tuning range of the PLL needs to be at lest 15.6 MHz. Since the VCO frequency is twice the PLL frequency, this is easily achievable with VCOs available in the industry.

The degree to which quantization spurs can be minimized depends on the frequency resolution over which the PLL can be tuned. For example, for a 16.8 MHz output, the minimum step size is less than 0.02 Hz according to $$\Delta F_{out,min} = \frac{1e9}{59} - \frac{1e9}{59 + \frac{1}{2^{24}}}$$

where 59 is the N-value required for a 16.8 MHz output given a reference frequency 205 of 1 GHz.

The second method reduces mismatch error in the delay line integral to DDS 230 by providing independently tunable individual delay elements in said delay line. While the delay line may be placed in a delay locked loop where all the delay elements are tuned together in order to fix the total delay to one wavelength, the ability of the present invention to tune individual elements allows for mismatch error to be greatly reduced. Also, the method of tuning individual delay elements is compatible with dithering (not shown).

Figure 3:
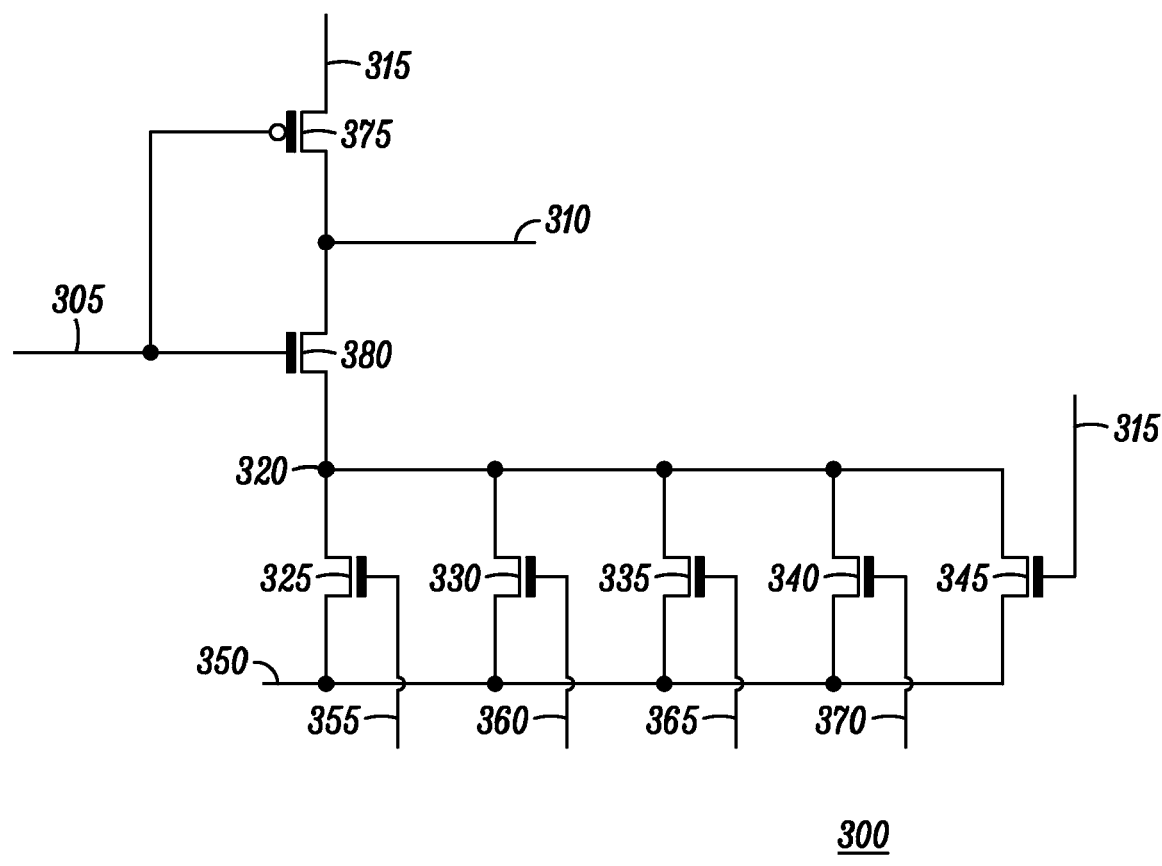
FIG. 3 is an exemplary schematic of a delay line output inverter with 4-bit tuning, utilized in accordance with certain embodiments.

Refer to FIG. 3, which is an exemplary schematic 300 of a delay line output inverter with 4-bit tuning, utilized in accordance with certain embodiments of the present invention. Individual elements are tuned by controlling the current through the inverter which is transistor 375 and transistor 380. Input 305 is the inverter input, and output 310 is the inverter output. Signal 320 is the junction point connecting the inverter to the controlled resistance to Vss 350 as provided by the parallel combination of transistor 325, transistor 330, transistor 335, transistor 340, and transistor 345. Power to the overall device is Vdd 315 and Vss 350. Binary weighted NMOS transistors, comprised of transistor 325, transistor 330, transistor 335, transistor 340, and transistor 345, are turned on or off to control the current through the inverter comprised of transistor 375 and transistor 380. The device sizes may be optimized for linear delay response. Since the delay is controlled digitally internal by the state of tap 355, tap 360, tap 365, and tap 370, it is easy to apply dither to one or more of the taps to further reduce spurious frequencies in output 310. Note that the circuit shown performs an inverter function, and that two such circuits may be cascaded to form a noninverting buffer. Transistor 345 has its gate tied to Vdd 315, which ensures that the inverter will remain on even if transistor 325, transistor 330, transistor 335, and transistor 340 are turned off. The NFET tuning elements may be binarily weighted with, for example. sizes 1.5, 3, 6, and 12, respectively.

Figure 4:
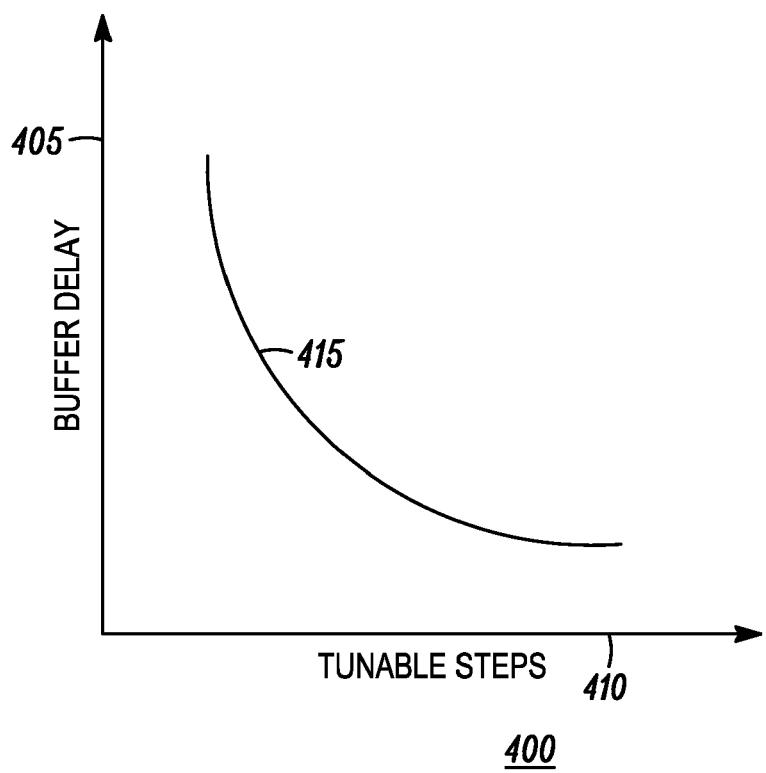
FIG. 4 is an exemplary graph depicting delay vs. tuning steps for one compensated output buffer, utilized in accordance with certain embodiments.

Refer to FIG. 4, which is an exemplary graph 400 depicting delay vs. tuning steps for one compensated output buffer, utilized in accordance with certain embodiments of the present invention. The vertical axis is buffer delay 405, and the horizontal axis is tunable steps 410. Buffer delay 405 increases in the upward direction, and tunable steps 410 (i.e. current through the inverters) increases to the right. It is clear that buffer delay 405 decreases monotonically as tunable steps 410 are increased. Curve 415 will be changed if the weighting between steps is modified, or if the accuracy of individual steps varies.

Figure 5:
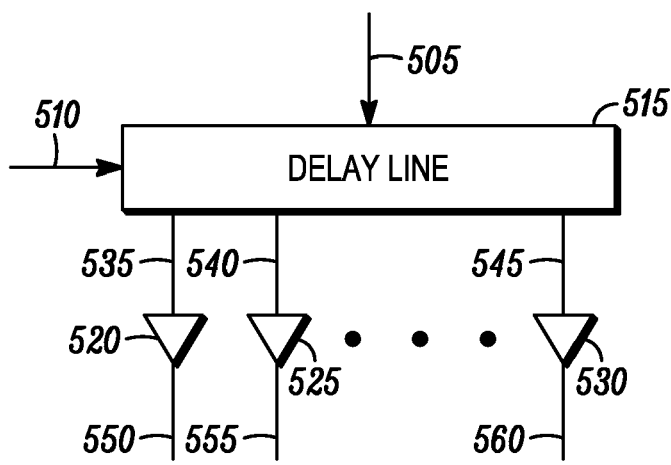
FIG. 5 is an exemplary block diagram of a delay line with tunable buffers on the output of each tap, utilized in accordance with certain embodiments.

Refer to FIG. 5, which is an exemplary block diagram 500 of a delay line with tunable buffers on the output of each tap, utilized in accordance with certain embodiments of the present invention. In order to compensate out mismatch errors in the delay line, we have added the ability to tune the delay seen at each tap output. The delay lock loop tuning will conflict with any attempt to directly tune the signal path inverters in the delay line. Therefore the tuning occurs in the output buffers of each tap. Reference frequency 510 is applied to the input of delay line 515. vtune 505 is applied to a second input of delay line 515. Delay line output 535 is a first output of delay line 515, delay line output 540 is a second output of delay line 515, and delay line output 545 is an Nth output of delay line 515. Delay line output 535, delay line output 540, through delay line output 545, may be sequential in terms of delay. Buffer 520, buffer 525, through buffer 530, are delay tunable as described previously. Buffer outputs are, respectively, tap0 550, tap1 555, through tapN 560. It is clear that delay line output 535 through delay line output 545 have been functionally replaced by programmable delay outputs tap0 550 through tapN 560. This provides delay line vernier adjustability of delay on a per-output basis, and the benefits of this additional functionality have been discussed previously.

Figure 6:
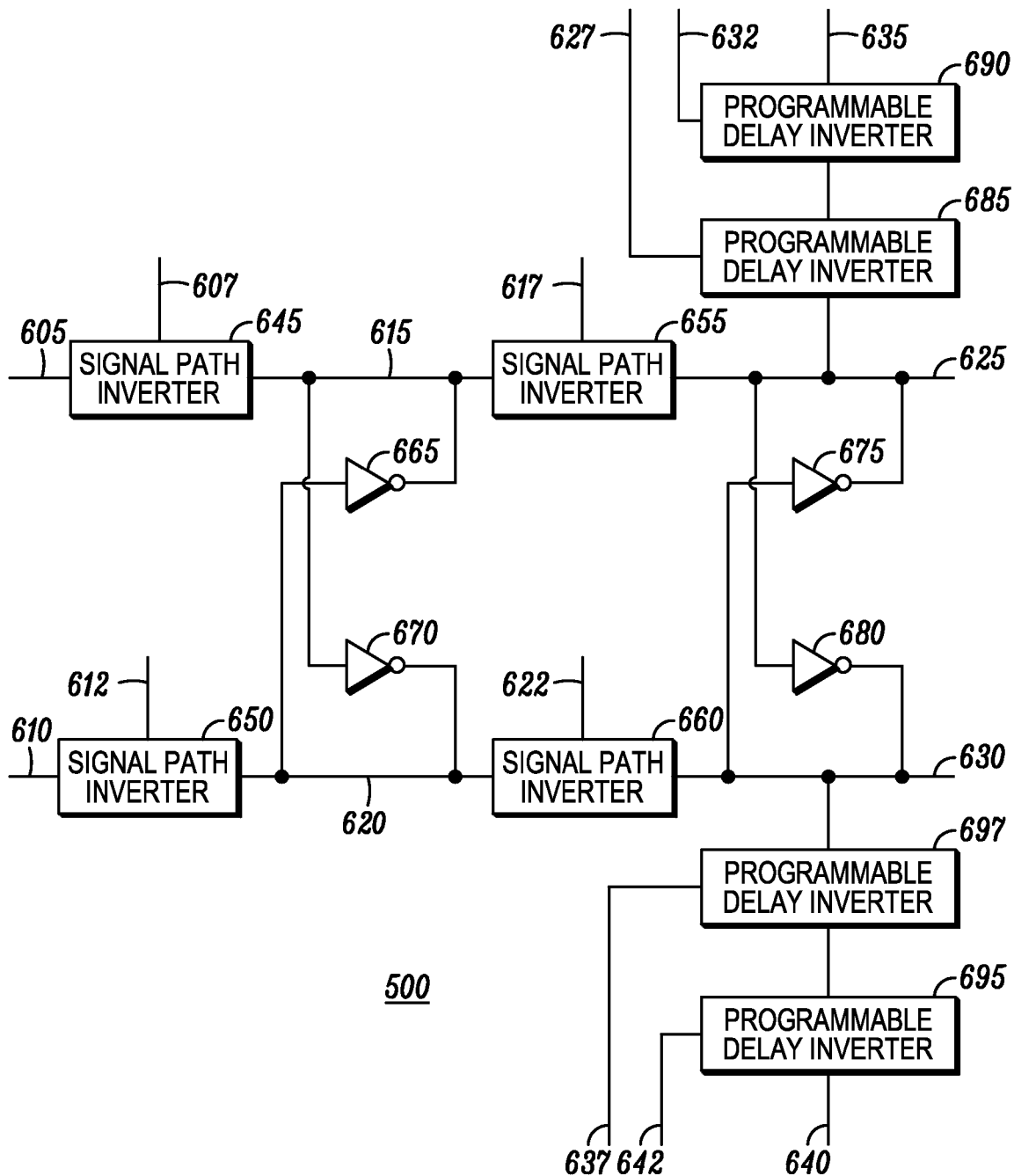
FIG. 6 is an exemplary schematic of one delay stage in a cross coupled delay line, utilized in accordance with certain embodiments.

Refer to FIG. 6, which is an exemplary schematic 600 of one delay stage in a cross coupled delay line, utilized in accordance with certain embodiments. Input 605 and Input 610 are complimentary reference signals that, for the first stage, may come from a PLL or other frequency generation means. Output 625 and output 630 feed into the inputs of the next stage, and so on. Multiple delay stages are cascaded together in this manner to form a delay line. Output 625 and output 630 of the final stage form the final output. Cross coupled delay lines are often used to maintain 50% duty cycle across the entire delay line. There are three types of inverters shown. The signal path inverter 645, signal path inverter 650, signal path inverter 655, and signal path inverter 660 accept tuning voltage vtune 607, vtune 612, vtune 617, and vtune 622, respectively, if the delay line is placed in a delay locked loop. This tuning voltage is applied to the gate of an NMOS device in a current starved inverter configuration. The cross coupled inverters, inverter 665, inverter 670, inverter 675, and inverter 680, require no tuning and their only purpose is to ensure 50% duty cycle down the delay line. The third type of inverter is used to generate the differential output tap signals, and these are programmable delay inverter 685, programmable delay inverter 690, programmable delay inverter 697, and programmable delay inverter 695. These are the programmable delay inverters shown in FIG. 3. The delay programming inputs for these are programming input 627, programming input 632, programming input 637, and programming input 642, respectively.

The benefit of placing the tunable buffers outside of the signal path in this type of cross coupled delay line is that it does not conflict with the tuning voltage from the DLL and it does not interfere with the cross coupled devices attempting to maintain 50% duty cycle.

Tuning the output buffers, as shown above, rather than the signal buffers allows the implementation of a one and one-half wavelength delay line (not shown). In this topology, taps are selected from both sides of the differential delay line, whereas if the signal path inverters were tuned the cross coupled inverters would affect the other (differential) side of the delay line.

Those of ordinary skill in the art will appreciate that many other circuit and system configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, other types of devices and circuits may be utilized for any component or circuit shown herein as long as they provide the requisite functionality. A further example is that the described circuitries may be implemented as part of an integrated circuit, or a hybrid circuit, or a discrete circuit, or combinations thereof. Yet another example is that the features of the present invention may be adapted to various synthesizer requirements and to various programmable delay requirements. Note that differing delay weightings from those shown or discussed herein may be accommodated by the present invention. Accordingly, it is intended that the present invention embrace all such alternatives, modifications and variations as fall within the scope of the appended claims.

What is claimed is:

1. A structure for reducing mismatch error in a delay line, comprising:
    a delay line with a plurality of tap outputs;
    a plurality of independently programmable delay elements each placed at a respective one of the plurality of tap outputs; and
    wherein the independently programmable delay elements are operable to be independently adjusted to compensate for mismatch error at their respective tap output of the plurality of tap outputs.

2. The structure of claim 1, wherein the delay line performs an inversion function.

3. The structure of claim 2, wherein the plurality of independently programmable delay elements perform the inversion function of the delay line.

4. The structure of claim 3, further comprising two or more of the independently programmable delay elements to yield a non-inverting function of the structure.

5. The structure of claim 1, wherein the plurality of independently programmable delay elements are coupled in a differential configuration within a cross-coupled delay line structure.

6. The structure of claim 1, wherein the independently programmable delay elements are weighted in accordance with desired programmable steps.

* * * * *